United States Patent [19]

Roberts et al.

[11] Patent Number: 4,839,618
[45] Date of Patent: Jun. 13, 1989

[54] MONOLITHIC CRYSTAL FILTER WITH WIDE BANDWIDTH AND METHOD OF MAKING SAME

[75] Inventors: Gerald E. Roberts, Lynchburg; A. Gordon Staples, Evergreen; Samuel Toliver, Rustburg, all of Va.

[73] Assignee: General Electric Company, Lynchburg, Va.

[21] Appl. No.: 53,658

[22] Filed: May 26, 1987

[51] Int. Cl.$^4$ .......................... H03H 9/56; H03H 9/13; H03H 9/205

[52] U.S. Cl. ................................. 333/191; 333/189; 29/25.35; 310/312; 310/366

[58] Field of Search .................... 333/186–192; 310/312, 365, 366, 320; 29/25.35

[56] References Cited

U.S. PATENT DOCUMENTS

| | | | |
|---|---|---|---|
| 2,323,610 | 7/1943 | Koch | 310/366 |
| 2,571,167 | 10/1951 | Ruggles et al. | 310/312 X |
| 2,765,765 | 10/1956 | Bigler et al. | 310/312 X |
| 2,906,235 | 9/1959 | Hirsh | 310/312 X |
| 3,549,414 | 12/1970 | Curran et al. | 333/191 X |
| 3,573,672 | 4/1971 | Fair et al. | 333/191 |
| 3,600,675 | 8/1971 | Grenier | 29/25.35 X |
| 3,602,844 | 8/1971 | Sykes | 333/133 |
| 3,670,693 | 6/1972 | Rorick et al. | |
| 3,756,851 | 9/1973 | Rennick et al. | 333/191 |
| 3,866,155 | 2/1975 | Kobayashi et al. | 333/191 |
| 3,963,982 | 6/1976 | Roberts | 324/56 |
| 3,992,760 | 11/1976 | Roberts | 29/25.35 |
| 4,093,914 | 6/1978 | Peppiatt et al. | 324/56 |
| 4,107,349 | 8/1978 | Vig | 29/25.35 X |
| 4,112,134 | 9/1978 | Buynak et al. | 29/25.35 X |
| 4,112,147 | 9/1978 | Thompson | 310/320 X |
| 4,131,484 | 12/1978 | Caruso et al. | 29/25.35 X |
| 4,163,959 | 8/1979 | Dailing | 333/197 |
| 4,323,031 | 4/1982 | Kaplan | 118/720 |
| 4,329,666 | 5/1982 | Arvanitis | 333/191 |
| 4,343,827 | 8/1982 | Thompson | |
| 4,468,582 | 8/1984 | Fujiwara et al. | 310/366 X |
| 4,481,488 | 11/1984 | Dworsky | 333/189 |
| 4,627,379 | 12/1986 | Roberts et al. | 118/729 |
| 4,642,505 | 2/1987 | Arvanitis | 310/312 |

OTHER PUBLICATIONS

Musashino Electrical Communication Laboratory, N. T. T. Musachino, Japan 180 "High Performance Monolithic Crystal Filters with Stripe Electrodes", by Noboru Watanabe et al; (1975); pp. 333–340.

*Primary Examiner*—Marvin L. Nussbaum
*Attorney, Agent, or Firm*—Nixon & Vanderhye

[57] ABSTRACT

A monolithic coupled-dual resonator crystal filter is produced for operation with wide bandwidths (especially at high center frequencies) by providing an ultra-small gap between juxtaposed resonator electrodes. A gap width of substantially less than 0.006 inch is obtained by laser-machine trimming the gap. An initial single electrode may thus be divided into a pair of such juxtaposed resonator electrodes. Further metallic plate-back is provided on the electrodes for center-frequency control. Although this typically may decrease the coupling bandwidth somewhat, an increased thickness of metallic plate-back material on the ground electrode, opposite the ultra-thin gap area on the active side of the crystal wafer, provides precisely controlled extra wide bandwidth.

12 Claims, 3 Drawing Sheets

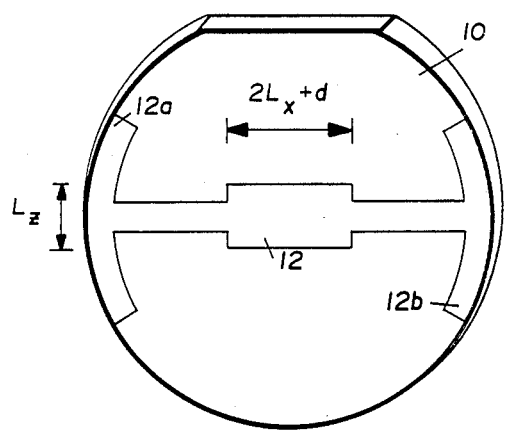
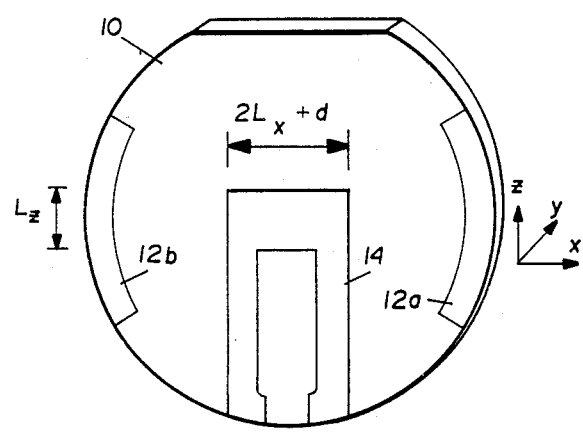
FIG. 1a
FIG. 1b
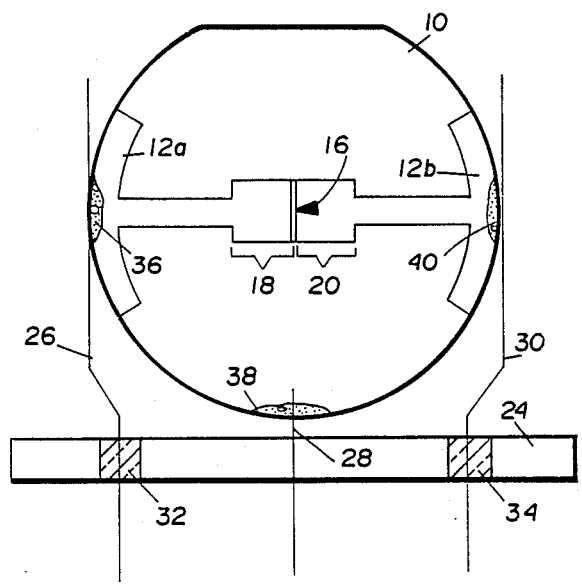
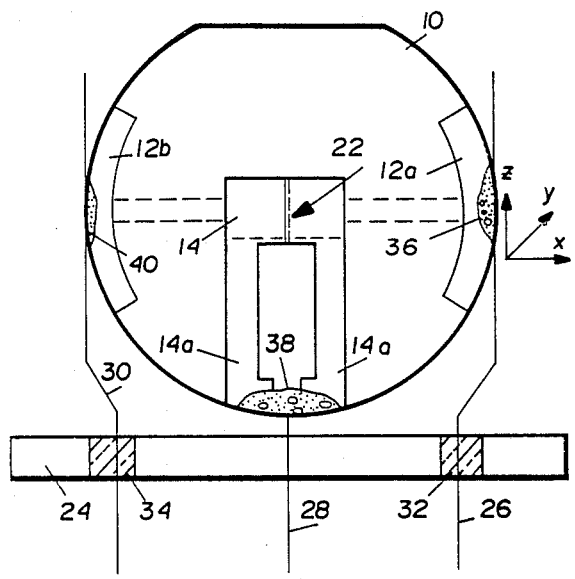
FIG. 2a
FIG. 2b

MONOLITHIC CRYSTAL FILTER WITH WIDE BANDWIDTH AND METHOD OF MAKING SAME

This application is generally related to a monolithic (e.g., coupled-dual resonator) crystal filter and to a method for manufacturing same. It is particularly directed to the achievement of such filters having extraordinarily wide operational bandwidths (especially at extraordinarily high center frequencies) as compared to conventional monolithic filter structures.

Some commonly assigned generally related prior patents and patent applications directed to monolithic coupled-dual resonator crystal filter structures and methods for making same are listed below:
  U.S. Pat. No. 3,963,982—Roberts (1976)
  U.S. Pat. No. 3,992,760—Roberts (1976)
  U.S. Pat. No. 4,093,914—Peppiatt et al (1978)
  U.S. Pat. No. 4,627,379—Roberts et al (1986)
  U.S. Application Ser. No. 851,910 which s a file wrapper divisional of Ser. No. 676,125 filed Nov. 29, 1984 (now abandoned).

The general overall structure and theory of operation for monolithic coupled-dual resonator crystal filters is well-known in the art. In general, such filters provide a bandpass filter transmission characteristic having a much higher quality factor (Q) than is attainable with lumped capacitance/inductance filter structures. Such monolithic quartz crystal filter structures are also of a very compact size as compared to lumped component filters.

In general, monolithic crystal filters of this type are formed by deposition of shaped electrode structures onto opposing, generally planar, sides of a quartz crystal wafer. The "active" side typically includes a pair of juxtaposed resonator electrodes while the "ground" side typically includes at least one further electrode disposed generally opposite the resonator electrodes on the other side of the wafer.

It is generally known that the separation gap between the resonator electrodes is inversely proportional to filter bandwidth and that the mass loading of the electrodes is generally determinative of filter center frequency. The relationship between the many parameters of this system (e.g., electrode area, mass, relative location, etc.,) are, unfortunately, interrelated to some extend such that changing any one of these parameters typically affects to some degree many if not all of the important functional characteristics of the filter system. Accordingly, typical manufacturing processes involve real-time monitoring of one or more actual filter system responses to control final adjustment of parameters such as center frequency, bandwidth, etc. One particularly useful parameter to monitor during such manufacturing processes is the so-called synchronous peak separation frequency (SPSF) as described in the above-referenced related U.S. Pat. No. 4,093,914.

In conventional monolithic crystal filter manufacturing techniques, the nominal electrode dimensions are achieved by depositing metallic material through masks in a vapor deposition process. Thereafter, fine tuning of the filter characteristics is achieved by carefully controlled further deposition of electrode material in selected sub-portions of the electrode areas and/or in selectively removing or "trimming" electrode material earlier deposited. It is also known to increase coupling between the resonator electrodes by the deposition of strip electrodes therebetween and/or by the additional plating of electrode material on the ground electrode opposite the gap between resonator electrodes. Some prior art documents relating to laser machining of electrode structures for the purpose of adjusting at least the center frequency of such filters are identified below:
  Hokanson, et al—"Laser Machining Thin Film Electrode Arrays on Quartz Crystal Substrates", 23rd Annual Frequency Control Symposium, May 1969, pp. 163-170.
  Watanabe et al, "High Performance Monolithic Crystal Filters with Strip Electrodes", Electron. Commun. Japan, Vol. 57, Part A, pp. 53-60, 1975.
  U.S. Pat. No. 4,131,484—Caruso et al (1978)
  U.S. Pat. No. 4,642,505—Arvanitis (1987)

Other prior art patents generally relevant to the construction of piezoelectric crystal assemblies of this general type are described in many prior art documents, of which the following are merely a short non-exhaustive list:
  U.S. Pat. No. 2.323,610—Koch (1943)
  U.S. Pat. No. 2,571,167—Ruggles et al (1951)
  U.S. Pat. No. 2,765,765—Bigler et al (1956)
  U.S. Pat. No. 2,906,235—Hirsh (1959)
  U.S. Pat. No. 3,549,414—Currane et al (1970)
  U.S. Pat. No. 3,573,672—Fair (1971)
  U.S. Pat. No. 3,600,675—Grenier (1971)
  U.S. Pat. No. 3,670,693—Rorick et al (1972)
  U.S. Pat. No. 3,756,851—Rennick et al (1973)
  U.S. Pat. No. 3,866,155—Kobayashi et al (1975)
  U.S. Pat. No. 4,107,349—Vig (1978)
  U.S. Pat. No. 4,112,134—Buynak et al (1978)
  U.S. Pat. No. 4,112,147—Thompson (1978)
  U.S. Pat. No. 4,163,959—Dailing (1979)
  U.S. Pat. No. 4,323,031—Kaplan (1982)
  U.S. Pat. No. 4,329,666—Arvanitis (1982)
  U.S. Pat. No. 4,343,827—Thompson (1982).

As is apparent from such prior art documents, the most common conventional technique for forming nominal resonator electrode areas is to use a precision masking technique in conjunction with vapor deposition processes. Unfortunately, it has proved to be impossible to reliably control the gap width between the resonator electrodes to any less than about 0.006 inch using such conventional construction techniques. For this (and perhaps other related reasons), prior to this invention it was not practical to produce monolithic crystal filters in commercial quantities having bandwidths and greater than about 50 KHz at normal mobile radio IF center frequencies (with this value decreasing as the center frequency increases above 40 MHz).

In brief summary, especially for higher filter center frequencies, the spacing between the coupled dual-resonator electrode pairs must be substantially reduced while yet permitting sufficient metalization (i.e., plate-back) thicknesses (i.e., mass) to produce stable operation—and while still realizing the required high SPSF for a wide bandwidth. For example, a bandwidth of even 40 KHz at a center frequency of 45 MHz is an unusually wide bandwidth for this frequency by conventional standards.

Futhermore, because of RF radiation problems associated with high impedance termination at high RF frequencies, it is very desirable that monolithic crystal filters operating at these higher frequencies have extremely low termination impedances. This implies that a very narrow inter-electrode gap width must be realized over a fairly long gap length—which makes the "precision" masked base-plated resonator electrode pairs very difficult to realize in commercial practice. When one attempts to achieve commercial production of such higher frequency wide bandwidth filters using conventional masking techniques, the resulting range of expected variation in SPSF after the initial base plating operation is quite large—thus causing final frequency plating adjustments to become virtually impossible or, at best, very inefficient processes.

Now, however, we have discovered a new manufacturing technique which permits the realization of monolithic crystal filters having exceptionally wide bandwidths—even at exceptionally high center frequencies—while yet maintaining a very practice commercial manufacturing process.

In brief summary, a very accurate while still very narrow gap spacing between the resonator electrodes is achieved in an exemplary embodiment by initially base-plating a single resonator electrode and then subdividing it by laser machining operations into a pair of juxtaposed electrodes disposed on the "active" side of a quartz wafer. In this manner, an inter-electrode gap width substantially less than 0.006 inch (e.g., typically within the range of 0.001 to 0.005 inch, and possibly as low as 0.0002 inch) may be reliably and quickly achieved. Using available programmable laser machining apparatus, the process can even be accomplished in a very efficient batch processing mode (i.e., where a large number or "batch" of base-plated crystal blanks are laser trimmed virtually at the same time).

Although this very accurate, very small, gap width itself produces significantly increased coupling factors (and therefore significantly increased bandwidth), this coupling may be decreased somewhat by subsequent frequency adjustment plate-back onto sub-portions of the resonator electrodes. However, any such loss (which may be of minor proportions) can be more than compensated by increased deposition of electrode material on the other or "ground" side in the area opposite the gap. Indeed, it has been discovered that if an exceptionally heavy plate-back on the ground electrode (opposite the gap) is employed, a significant further increase in bandwidth (e.g., SPSF parameter) can be achieved. Typically, the plate-back on the ground electrode is simply continued until a desired filter bandwidth response is achieved provided sufficient resonator activity still remains (e.g., by monitoring the SPSF).

Furthermore, by using precise laser machining to define the inter-electrode gap (e.g. even for lower frequency or lower bandwidth crystal filters), the expected variation in center frequency and coupling or bandwidth filter parameters can be greatly reduced before entering final system adjustment processes (e.g., a final frequency adjustment by deposition of further electrode material on selected sub-portions of the resonator electrodes). That is, when conventional precision masking techniques are used for base-plating the resonator electrodes, the expected tolerances during large-scale commercial manufacturing can still be quite large because the conventional masking technique can only be realized with a limited degree of precision. With modern laser machining equipment being used to separate the initial single resonator electrode into a pair of electrodes or to precision trim the gap (e.g., typically in batch operations), there would be negligible further cost in also using the laser apparatus to precision rim the base-plated electrode pattern (e.g., in the gap area so as to reduce expected variation in coupling/bandwidth determining parameters of the filter and/or about the perimeter or other areas of the base-plate electrodes so as to reduce expected variation in center frequency parameters of the filters prior to final plate-back adjustments).

Using this invention, it already has been possible to fabricate monolithic dual resonator crystal filters having center frequencies well in excess of 40 MHz (e.g., up to a 57.5 MHz fundamental frequency with effective overtone operation as high as 150 MHz or even higher) and filter bandwidths well in excess of 30 KHz (e.g., on the order of 200 to 250 KHz). Such monolithic crystal filter structures with these exceptionally wide bandwidths and/or high center frequencies have not been possible to construct in the past using conventional mask techniques for base-plating the resonator electrode areas (and thus inherently defining the inter-electrode gap with no more precision than is possible using masking techniques for delineating the inner gap boundaries).

These as well as other objects and advantages of this invention will be more completely appreciated by carefully studying the following detailed description of a presently preferred exemplary embodiment of this invention in conjunction with the accompanying drawings of which:

FIGS. 1a and 1b show the active and ground side of a quartz crystal wafer after an initial electrode base plating operation;

FIGS. 2a and 2b show the "active" and "ground" side of the same crystal wafer after a laser trimming operation which separates the base electrode structure on at least the active side into two separate electrodes and after the wafer has been conventionally mounted in a holder/connector base;

Figures 3A, 3B:
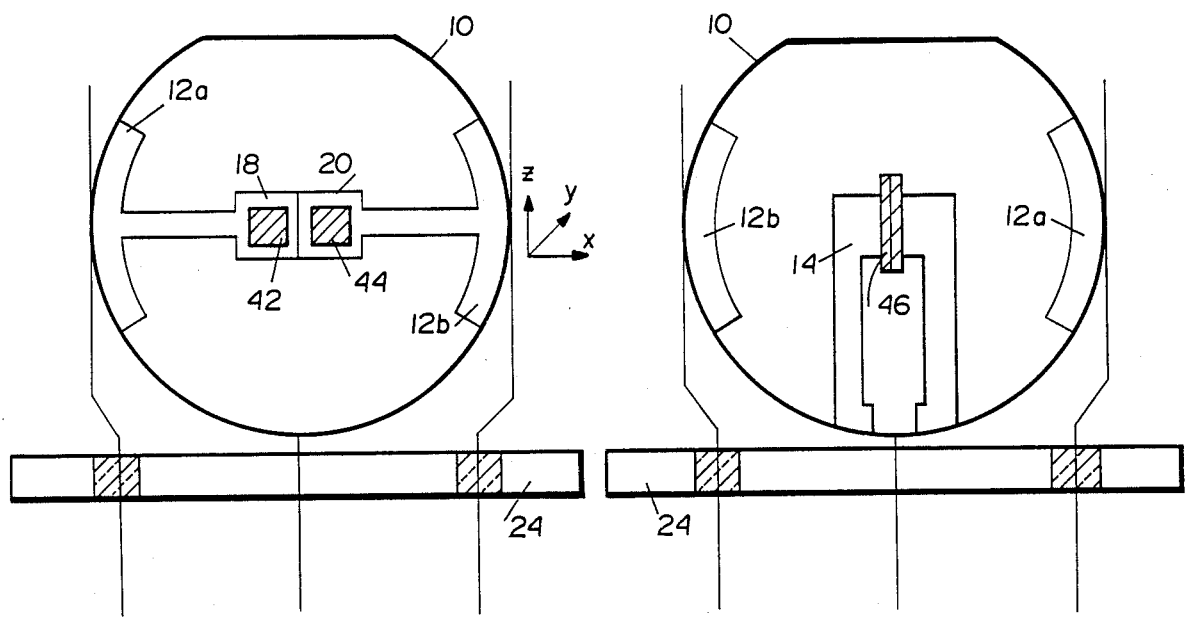
FIGS. 3a and 3b show the active and ground side of the same wafer after it has been subjected to further plate-back operations so as to adjust the center frequency and the bandwidth of the filter.

As earlier explained, to realize wide bandwidth coupling (especially at higher center frequencies), it is necessary to very accurately achieve very narrow spacing between a pair of crystal resonators, each formed by an electrode pair. Using conventional photo-etched masks for vapor deposition of electrode conductive areas, the minimum practical spacing between resonators is on the order of 0.006 inch to 0.008 inch. However, to achieve extraordinarily wide bandwidths (especially at higher frequencies), the spacing between resonator electrodes might have to be on the order 0.0015 inch or even less. A range of 0.001 to 0.005 inch spacing is, in general, believed to be an appropriate range for achieving relatively wide bandwidths (especially at higher frequencies). Furthermore, the use of unusually small electrode ares not only provides for some increased coupling (i.e., increased bandwidth) but also tends to reduce spurious out-of-band responses (or at least drive them considerably away from the desired active bandwidth of the filter within the frequency spectrum).

As shown in FIGS. 1a and 1b, a thin quartz crystal wafer 10 (e.g., usually less than 0.004 inch thickness for an At-cut wafer which is ground, lapped or etched to an approximate desired frequency of operation) is initially "base-plated" (e.g., to a desired initial mass loading thickness usually less than 2500 angstroms or so for AT-cut wafers using conventional masked vapor deposition processes) with an electrode 12 on the "active" side (FIG. 1a) and with electrode 14 on the "ground" side (FIG. 1b). As can be seen in FIG. 1B, side contact areas 12a and 12b typically extend around an edge of the wafer's ground side so as to facilitate mechanical connections. Electrode 12 is then laser machined at line 16 (FIG. 2a) so as to divide the initially single electrode area of width $2L_x+d$ into two active juxtaposed resonator electrodes 18, 20 (each of dimension $L_x$ along the x axis). As indicated in FIG. 2b, there may unintentionally also be some loss of material along a similar line 22 on the ground side in electrode 14 (which will, in the exemplary embodiment, later be plated over).

After the laser trimming operation (using conventional available laser machining tools which may be programmed so as to batch process a plurality of wafers), wafer 10 is conventionally attached to a holder base 24 and to its respective three electrodes 26, 28 and 30. As depicted in FIGS. 2a nd 2b, electrodes 26 and 30 are physically attached within apertures of base 24 with insulating (typically glass) feed-through sleeves 32, 34, respectively. The center lead 28 may be electrically connected with metallic base 24 to serve as a true ground electrode in a typical embodiment. The upper portions of electrodes 26, 28 and 30 are physically attached with conductive (silver) cement to contact areas 12a, 14a and 12b as shown at 36, 38 and 40, respectively.

As is well-known in the art, the initial base-plate leaves the crystal center frequency somewhat high so that it can be tuned downward to the desired center frequency by the application of additional electrode mass ("frequency adjust spots") 42, 44 as depicted in FIG. 3a. As will be recognized, this additional plate-back on the resonator electrodes may reduce coupling (i.e., bandwidth) somewhat. However, any such loss in bandwidth is more than compensated for by the sue of additional plate-back 46 applied on the ground side of wafer 10 in the area just opposite gap line 16 on the active side (thereby also surely plating over any possible loss of material along line 22 on the ground side due to the laser trimming process). In effect, plate-back 46 is applied as needed to get a desired wide bandwidth while the frequency adjust plate-back 42, 44 is applied as needed to get the desired center frequency for the filter.

As depicted in FIGS. 1a-3b, the thickness of the wafer 10 and of the various electrode materials is in the y dimension while two-dimensional areas of the electrodes are measured in the x,z dimensions.

In one exemplary embodiment, resonator electrodes 18, 20 were laser machined to have a gap spacing therebetween of approximately 0.0015 inch while the finished dimensions of the resonator electrodes were approximately $L_x=0.029$ inch and $L_z=0.031$ inch (e.g., an area of approximately 0.0009 square inch). It is preferred in some exemplary embodiments to have electrode areas no larger than approximately this size. In this particular exemplary embodiment, a frequency adjust plate-back of approximately 60 KHz was used and the resulting SPSF coupling factor was discovered already to be quite wide banded (e.g., in the 75 KHz to 80 KHz range). The accurate narrow spacing of approximately 0.0015 inch between resonator electrodes was achieved by laser machining an initially unitary electrode 12 (which caused partial removal of material on the opposite or "ground" side along line 22—which was later more than replaced by plate-back 46).

Subsequently, the coupling SPSF factor was adjusted to the 200 KHz target by depositing an extremely thick plating 46 on the ground side in an area opposite the gap 16 between resonators. Although the exact thickness of the plate-back 46 is not known, the relevant plate-back operation was simply continued as long as necessary by monitoring the upper or lower short circuit peak response of the filter during the plating operations (a true SPSF measurement involving both peaks cannot efficiently be monitored in a dynamic mode during plate-back with existing technology due to the extraordinarily wide coupling factors which are achieved with this invention).

Finally, a further final frequency adjust plate-back operation can be performed to add even further material to plate-back areas 42, 44 thus leaving the center frequency of the filter at precisely the desired point (e.g., because the center frequency is typically a more sensitive and important parameter than the bandwidth which, although possibly slightly affected by the final frequency plate-back, should not be greatly changed by the final frequency plate-back operation).

Typically, the final frequency plate-back is achieved by conventional vapor metal deposition of silver or gold on the active side in the areas 42, 44 and depicted in FIG. 3A. The coupling factor (SPSF) may be increased somewhat by positioning the frequency plate-spots relatively close to the gap 16 between the resonators 18, 20 (care being taken not to plate across the gap 16).

The achievement of a very accurate and very narrow spacing between resonator electrodes 18, 20 (especially when used in conjunction with an unusually heavy plate-back 46 opposite the gap on the ground side of the wafer) is believed to be particularly important in producing the exceptionally wide bandwidth response of the exemplary embodiment. As previously mention, the achievement of this monolithic crystal filter structure is, in the exemplary embodiment, achieved by a fabrication method which initially lays down a unitary base-plate electrode 12 in the resonator area of the crystal wafer 10. A laser machining operation is then used to physically and electrically separate the single electrode 12 into two resonator electrodes 18, 20 while realizing an unusually narrow yet accurately dimensioned gap spacing 16 substantially less than the 0.006 inch minimum typically achievable with conventional masked vapor deposition processes. (As understood by those in the art, the actual resonator areas underlying resonator electrodes 18, 20 are also defined by opposing areas of the ground electrode 14 on the opposite side of wafer 10.) This division of the initial unitary electrode 12 into a pair of juxtaposed resonator electrodes 18, 20 with an accurate extremely narrow gap spacing is followed by an exceptionally heavy plate-back 46 on the ground side at a location opposite gap 16.

Prototype units have been realized using the method of this invention with coupling (i.e., bandwidth) in the 80 KHz to 250 KHz range. It is believed that the technique can be employed for achieving coupled dual resonator crystal filters having bandwidths in the 50 KHz to 300 KHz range (even at higher center frequencies where smaller bandwidths are traditionally encountered). Such higher bandwidth filters (especially at higher frequencies) may be particularly useful for space and military applications.

In the aforementioned exemplary embodiment, the fabricated quartz wafer blanks were initially etched into the 21.456 MHz to 21.475 MHz center frequency range, followed by a nickel over aluminum base-plate (e.g., 180 angstroms of nickel over various thicknesses of aluminum based on the particular etch range (such as 770 angstroms of aluminum for etch limits of 21.456 MHz to 21.462 MHz). The resulting base-plate produced an electroded crystal with initial resonator frequency in the 21.415 to 21.430 MHz range.

The electroded crystal plate was then mounted to a holder base 24 and cemented as shown in FIGS. 2A and 2B. The crystal was then laser trimmed with a single pass along line 16 to produce an effective space between electrodes 18, 20 of approximately 0.0015 inch. In the constructed samples, the initial dimensions of single resonator 12 were $2L_x + d = 0.059$ inch and $L_z = 0.031$ inch. Of course, after laser trimming, the gap dimension was d = 0.0015 inch and each of the now separate resonator electrodes 18, 20 had dimensions $L_x = 0.02875$ inch and $L_z = 0.031$ inch.

The mounted crystal, prior to laser trimming, produced a resonance when measured from one lead on the active side to the ground side in the range of 21.403 MHz to 21.425 MHz. After laser trimming, the resulting short circuit resonant peaks appear and units tested reveal the lower short circuit peak to be in the range from 21.3980 MHz to 21.4106 MHz while the upper short circuit peak was in the 21.478 to 21.486 MHz range.

Figure 4:
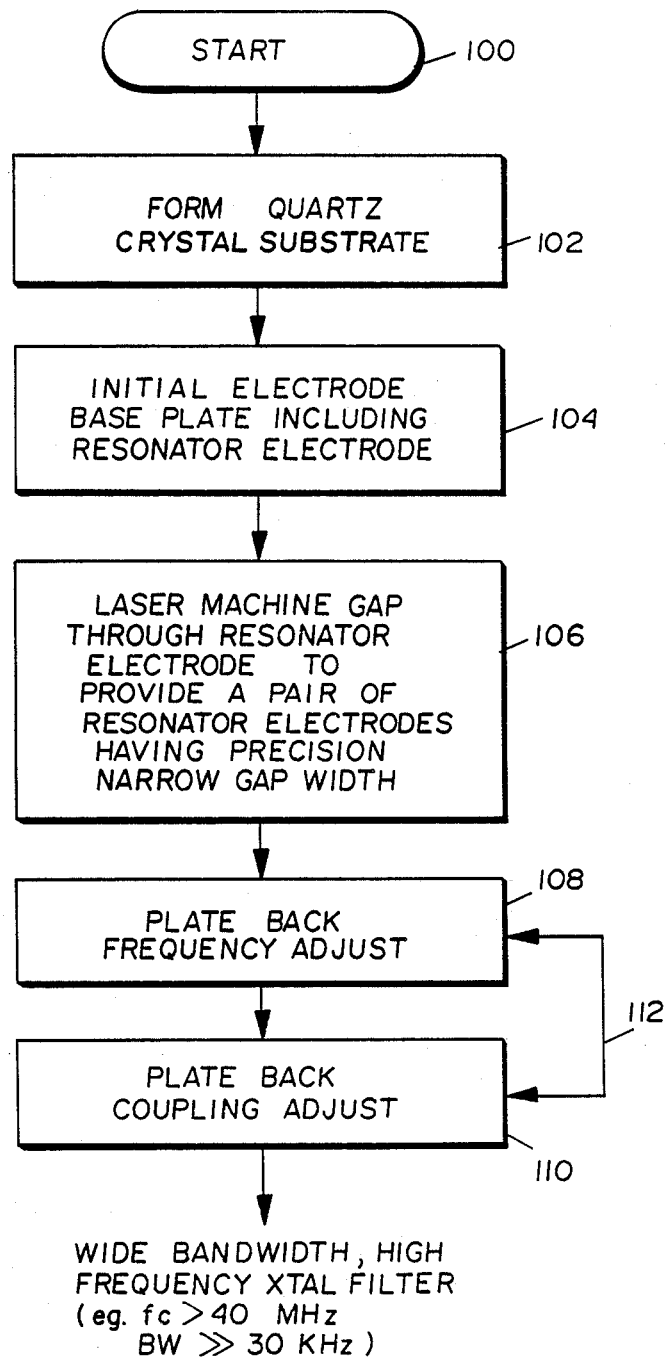
FIG. 4 is a flowchart depicting several salient manufacturing steps in the novel process used to form the novel filter structure of this invention.

The manufacturing method employed in the exemplary embodiment is briefly depicted in the flowchart of FIG. 4. From starting point 100, a conventional quartz crystal substrate is formed using conventional processes at 102. An initial electrode base-plate is applied to the crystal substrate at 104 using conventional masked vapor deposition processes—but including a single resonator electrode in the exemplary embodiment. (It will be understood that an ill defined "gap" of extremely narrow dimensions might alternately be attempted and later "cleaned" up by laser trimming.)

Using conventional programmable laser machining apparatus, the accurate very narrow gap 16 is then laser trimmed at step 106 through the resonator electrode(s) to provide a pair of separate resonator electrodes 18, 20 having a precision narrow gap width (e.g., in the range of 0.001 to 0.005 inch) therebetween all along the gap length. Thereafter, frequency plate-back adjustments may be made at 108 (taking care not to plate across the precision formed gap between resonator electrodes) and plate-back coupling adjustments made at 110 so as to achieve the desired novel wideband high-frequency crystal filter (for example having a center frequency greater than about 40 MHz and having a bandwidth much greater than about 30 KHz). As indicated by connecting line 112, the order (and possible repetition) of the frequency plate-back adjustment step 108 and the coupling plate-back adjustment step 110 may be controlled as desired to produce the requisite final center frequency and bandwidth.

AS previously mentioned, the precision laser trimming adjustment of gap width may be used on even lower frequency, narrower bandwidth filters (e.g., having possibly wider gap width between resonator electrodes) to reduce the statistical variation of base-plated crystal wafers going into the final frequency and coupling adjustment plate-back steps 108, 110. In this manner, the efficiency and yield of large scale commercial filter production processes can be materially enhanced.

While only a few exemplary embodiments of this invention have been described in detail, those skilled in the art will recognize that may modifications and variations may be made in these exemplary embodiments while still retaining some of the novel features and advantages of this invention. Accordingly, such variations and modifications are intended to be included within the scope of the appended claims.

What is claimed is:

1. A monolithic bandpass crystal filter comprising:
   a crystal wafer having two sides;
   a pair of juxtaposed electrodes formed with extended leads for connection to other circuits and disposed on a first side of said wafer without conductive coupling but with electroacoustic coupling via said wafer with a gap therebetween which is substantially less than 0.006 inch in width, said gap having been formed by a laser trimming operation which also thereby forms said pair of electrodes from a singular conductive member by separating it into two electrically unconnected portions;
   at least one further electrode disposed on the second side of said wafer opposite said pair of juxtaposed electrodes.

2. A monolithic crystal filter as in claim 1 wherein said gap width is within the range of 0.001 to 0.005 inch.

3. A monolithic crystal filter as in claim 1 wherein each of said pair of juxtaposed electrodes are dimensioned to be no greater than about 0.0009 square inch in area.

4. A monolithic crystal filter as in claim 1 wherein said electrodes are dimensioned and located so as to provide a filter center frequency in excess of about 40 MHz and a filter bandwidth in excess of about 50 KHz.

5. A monolithic crystal filter as in claim 1 having a filter bandwidth in excess of 100 KHz.

6. A monolithic bandpass crystal filter comprising:
   a crystal wafer having two sides;
   a pair of juxtaposed electrodes disposed on a first side of said wafer without conductive coupling but with electro-acoustic coupling via said wafer with a gap therebetween which is substantially less than 0.006 inch in width, said gap having been formed by a laser trimming operation;
   at least one further electrode disposed on the second side of said wafer opposite said pair of juxtaposed electrodes.

7. A method of making a wideband, high frequency bandpass monolithic crystal filter on a crystal wafer having first and second sides, said method comprising the steps of:
   forming conductive electrodes on each of said first and second sides of the wafer, said electrodes each having extended leads for connection to other circuits and being disposed in generally opposing positions; and
   laser trimming a slot through electrode material on at least said first side so as to accurately divide said electrode material and thus, by separating a singular conductive electrode by laser trimming, to provide a pair of completely separated but juxtaposed first electrodes with a gap therebetween which is substantially less than 0.006 inch in width.

8. A method as in claim 7 wherein said gap width is within the range of 0.001 to 0.005 inch.

9. A method as in claim 7 wherein each of said juxtaposed electrodes are dimensioned to be no greater than about 0.0009 square inch in area.

10. A method as in claim 7 wherein said electrodes are dimensioned and located so as to provide a filter center frequency in excess of about 40 MHz and a filter bandwidth in excess of about 50 KHz.

11. A method as in claim 7 wherein said filter has a bandwidth in excess of 100 KHz.

12. A method of making a wideband, high frequency bandpass monolithic crystal filter on a crystal wafer having first and second sides, said method comprising:

forming conductive electrodes on each of said first and second sides of the wafer, said electrodes being disposed in generally opposing positions;

laser trimming a slot through electrode material on at least said first side so as to accurately divide said electrode material and thus provide a pair of completely separated but juxtaposed first electrodes with a gap therebetween which is substantially less than 0.006 inch in width; and depositing further electrode material onto the electrode located on said second side opposite said gap to produce an area of increased thickness as compared to other areas of said electrode located on said second side.

* * * * *